(12) United States Patent
Liu et al.

(10) Patent No.: US 6,170,430 B1
(45) Date of Patent: Jan. 9, 2001

(54) GAS FEEDTHROUGH WITH ELECTROSTATIC DISCHARGE CHARACTERISTIC

(75) Inventors: Kuo-Shih Liu, Milpitas; Ernest Cheung, Cupertino; Prasanth Kumar, Fremont; John Ferguson, Oakland; Michael G. Friebe; Ashish Shrotriya, both of Santa Clara; William Nixon Taylor, Jr., Dublin, all of CA (US)

(73) Assignee: Applied Materials, Inc., Santa Clara, CA (US)

( * ) Notice: Under 35 U.S.C. 154(b), the term of this patent shall be extended for 0 days.

(21) Appl. No.: 09/290,780

(22) Filed: Apr. 13, 1999

(51) Int. Cl.[7] ............................. C23C 16/00; H05H 1/00
(52) U.S. Cl. ................. 118/723 E; 118/723 ER; 118/715; 156/345
(58) Field of Search .................. 118/723 E, 715, 118/723 ER, 723 AN; 156/345

(56) References Cited

U.S. PATENT DOCUMENTS

| | | |
|---|---|---|
| 573,558 | 12/1896 | Voss . |
| 2,150,167 | 3/1939 | Hutchins et al. .......................... 175/30 |
| 2,329,085 | 9/1943 | Ridgway .................................. 201/72 |
| 4,549,161 | 10/1985 | McTavish et al. ....................... 338/20 |
| 5,000,113 | 3/1991 | Wang et al. ............................. 118/723 |
| 5,557,250 | 9/1996 | Debbaut et al. ......................... 338/21 |
| 5,725,675 | 3/1998 | Fong et al. .......................... 118/723 E |
| 5,968,276 * | 10/1999 | Lei et al. ............................. 118/723 E |

* cited by examiner

Primary Examiner—Richard Bueker
Assistant Examiner—P. Hassanzadeh
(74) Attorney, Agent, or Firm—Thomason, Moser & Patterson

(57) ABSTRACT

A gas feedthrough in a semiconductor processing apparatus comprises a static-dissipative composite material. This material is characterized by good resistance to electromigration and is preferably made of a homogeneous material. This apparatus for preventing the transfer of energy to a gas flown through a gas line and comprises a gas feedthrough comprising a static-dissipative material, the feedthrough having a first end for abuttingly contacting an electrically energized member and a second end for contacting a grounded member, the feedthrough defining a void therein along its length to house a gas line.

10 Claims, 3 Drawing Sheets

GAS FEEDTHROUGH WITH ELECTROSTATIC DISCHARGE CHARACTERISTIC

BACKGROUND OF THE INVENTION

1. Field of the Invention

The present invention relates to the field of semiconductor device processing and, more particularly, to a gas feedthrough which provides processing gases into a processing chamber. More specifically, the present invention relates to a constant voltage gradient gas feedthrough made of a static-dissipative composite.

2. Background of the Related Art

In the fabrication of integrated circuits, chemical vapor deposition (CVD) is a well known process for depositing materials onto a substrate. CVD processes commonly require that process gases be delivered into a processing chamber where these gases undergo chemical reactions to form a desired layer on the surface of the substrate.

Gas distribution plates are used in CVD chambers to uniformly distribute the process gases delivered into the chamber. Uniform gas distribution is necessary to achieve uniform deposition characteristics on the surface of the substrate positioned in the chamber. In some CVD applications, an electrical current is applied to a gas outlet manifold on the gas distribution plate which introduces the process gases into the chamber to provide the necessary power to generate a plasma within the chamber.

Typically, an RF power source provides an energy potential to the outlet manifold which delivers the process gases into the chamber. The RF power generates a plasma within the chamber by exciting the process gases into a plasma state. Once excited, the precursor gases react within the chamber and the desired film typically deposits on the surface of the substrate.

In applications in which gases are introduced into the chamber through a gas distribution plate having an RF hot outlet manifold, energy applied to the outlet manifold must not be conducted to the gases being fed into the chamber. Typically, a grounded gas inlet manifold is provided upstream of the biased (i.e., RF hot) gas outlet manifold which provides the gases into the chamber and an insulative block is positioned therebetween to house gas lines which are typically made of quartz. A resistive sleeve is disposed around the gas lines to shield the voltage applied to the outlet manifold away from the gases fed through the gas lines while providing a resistive path between the inlet and outlet manifolds. The resistive sleeve is preferably held in place between the grounded gas inlet manifold and the RF hot gas outlet manifold by spring washers located at both ends of the sleeve.

In a typical system, a resistive sleeve of a composite material is positioned between the grounded inlet manifold and the RF hot outlet manifold to provide a path of resistance for the energy which is applied to the gas outlet manifold. However, the composite material currently being used requires that a metal contact be formed on the ends of the resistive sleeve to facilitate transfer of energy from the RF hot manifold to the resistive sleeve. The ends of the composite sleeves must undergo a metallization process to provide contacts which abut the inlet and outlet manifolds. It has been found that over time, the contacts formed on the ends of the composite sleeves by metallization wear out or break down under high power applications, thereby compromising the function of the resistive sleeve and altering the impedance of the CVD chamber. Further, the assembly steps required to mount the sleeves with the spring washers all too often result in out-of-specification resistance through the resistive sleeve.

If energy is conducted to the gas, the electrical configuration of the chamber may be altered, thereby adversely affecting the operation of the chamber. For example, if the energy applied to the gas outlet manifold is conducted to the gas, an unstable situation can result thus affecting the characteristic chamber impedance in an unpredictable manner.

U.S. Pat. No. 5,725,675, incorporated herein by reference, provides a resistive sleeve for use in a gas feedthrough which does not require formation of metal contacts on the ends of the feedthrough. This feedthrough is made of a material which has improved electromigration performance so that a constant voltage gradient can be maintained along the length of the feedthrough. This structure provides a constant voltage gradient across the feedthrough to the grounded manifold. This structure adequately solved the problems to which it was directed, but it includes a number of separate elements which require construction and assembly. Further, this structure includes components at the ends of the feedthrough which may alter the ohmic contacts at these ends and thereby alter the electrical characteristics of the feedthrough in unpredictable ways.

Thus, there also remains a need for a gas feedthrough that is formed as a unitary structure that easily couples inlet and outlet manifolds with predictable and reproducible impedance of the assembled feedthrough. Such a gas feedthrough should be formed of the minimum number of elements and should be made of readily available materials. Further, such a gas feedthrough should eliminate the troublesome resistive sleeve, thereby simplifying the assembly process, and simultaneously improving the quality of the entire semiconductor processing apparatus.

SUMMARY OF THE INVENTION

The present invention provides a gas feedthrough comprising a static-dissipative composite material. This material is characterized by good resistance to electromigration and is preferably made of a homogeneous material. This structure eliminates certain discrete components including the resistive sleeves of U.S. Pat. No. 5,725,675, and thereby provides predictable and reproducible ohmic characteristics of the feedthrough. In one aspect of the invention, the feedthrough is molded as a unitary block of a homogeneous static-dissipative composite having a bulk resistivity that is preferably of 1.25 to $5 \times 10^6$ ohm-centimeters. This is roughly related to the region of FIG. 3 herein of surface resistivity of from $10^6$ to $10^{10}$ ohms per square, since the unitary block is a solid, homogeneous composite.

In another aspect of the invention, a method is provided to prevent RF energy from coupling to a gas fed through a gas line by providing a feedthrough formed of a static-dissipative composite material to connect between the grounded manifold and the RF hot manifold. This material may also be referred to in this disclosure as an electrostatic discharge (ESD) plastic.

BRIEF DESCRIPTION OF THE DRAWINGS

So that one may understand the manner in which the above recited features, advantages and objects of the present invention are attained, a more particular description of the invention, briefly summarized above, may be had by reference to the embodiments thereof which are illustrated in the accompanying drawings.

DETAILED DESCRIPTION OF A PREFERRED EMBODIMENT

The present invention generally provides a method and apparatus for preventing the transfer of energy from a gas manifold or other gas inlet member to a gas which is fed through the apparatus, referred to herein as a feedthrough. The feedthrough is provided between the grounded inlet gas manifold and the biased gas outlet manifold so that the energy will not be conducted to the gases. The feedthrough is formed, preferably by molding or other appropriate process, of an electrostatic plastic so that the RF voltage potential at the gas outlet manifold declines linearly through the plastic to the grounded inlet manifold. A resistive path is therefore provided between the hot RF energy source at the outlet of the feedthrough and the gas lines through the feedthrough so that the RF energy is not conducted to the gas.

Specifically, the inventors have discovered that a composite plastic feedthrough can be disposed between the gas inlet manifold and gas outlet manifold around the gas lines positioned between the manifolds to provide a conduit which prevents transfer of the energy to gases fed through the gas lines. The ESD plastic feedthrough thereby eliminates the problems encountered as a result of metallization of the ends of a composite material to form metal contacts on the ends of the feedthrough.

Figure 1:
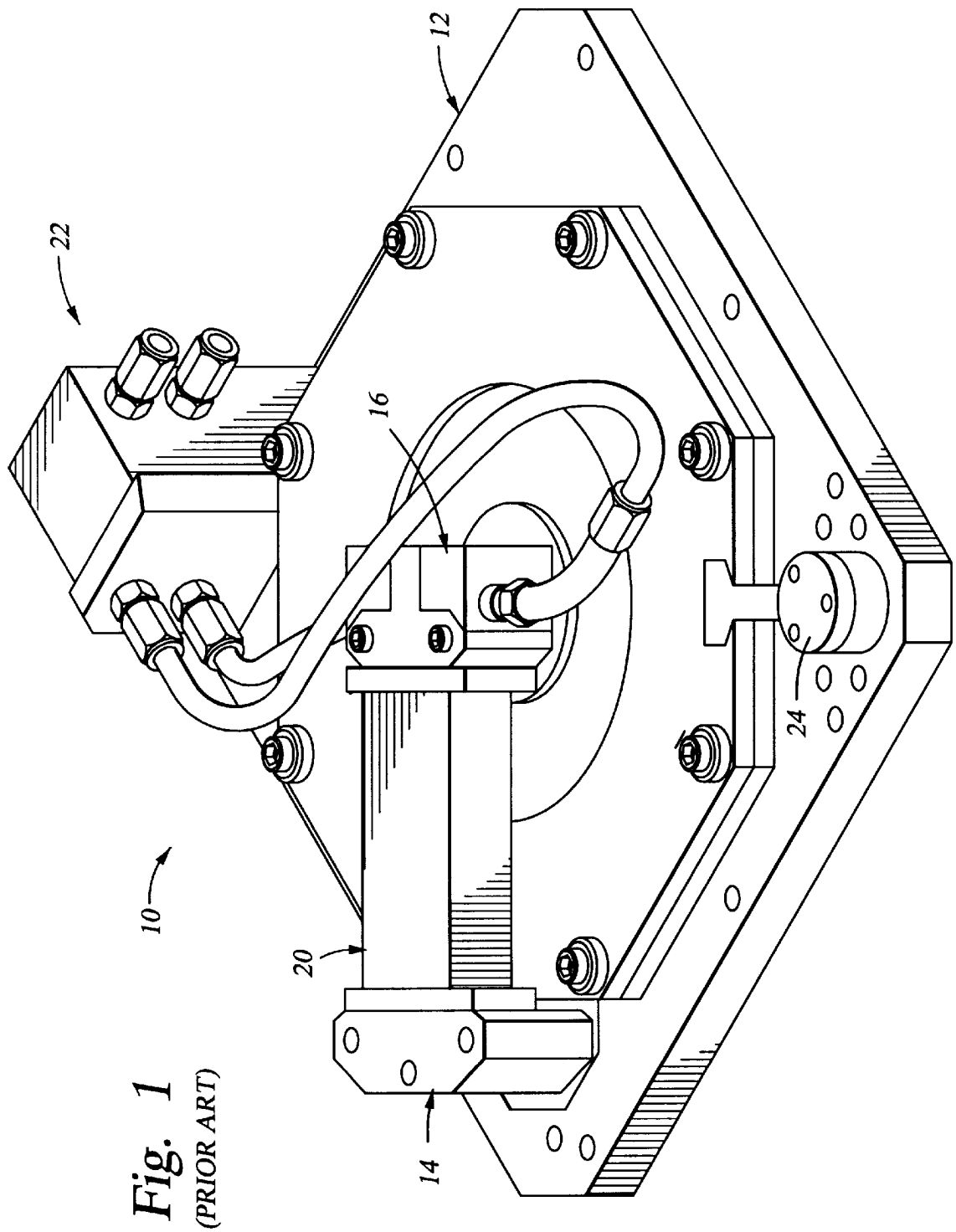

Referring to FIG. 1, a perspective view of a known gas distribution plate 10 is shown. The gas distribution plate 10 generally includes a base plate 12, a gas inlet manifold 14 to which a gas source is connected, a gas outlet manifold 16 which receives gases from the gas inlet and introduces the gases into the chamber, at least one gas line inside an insulating block 20, and a water manifold 22 to cool the gas distribution plate 10. The gas lines within the insulating block 20 connect the gas inlet manifold and the gas outlet manifold. The components of an exemplary gas distribution plate are described in detail in U.S. Pat. No. 5,725,675, entitled "Silicon Carbide Constant Voltage Gradient Gas Feedthrough," which is hereby incorporated by reference in its entirety.

In the system shown in FIG. 1 and typical of the art, the gas inlet manifold 14 is grounded and the gas outlet manifold 16 is energized from a radio-frequency (RF) source to provide an electrical potential within the chamber which facilitates generation of a plasma within the chamber. Gases are supplied from a gas source (not shown) to the chamber through the inlet gas manifold 14, then through gas lines inside the insulating block feedthrough 20 and into the gas outlet manifold 16 where the gases are evenly distributed over the surface of a substrate positioned within the chamber, such as for example through a showerhead assembly.

Figure 2:
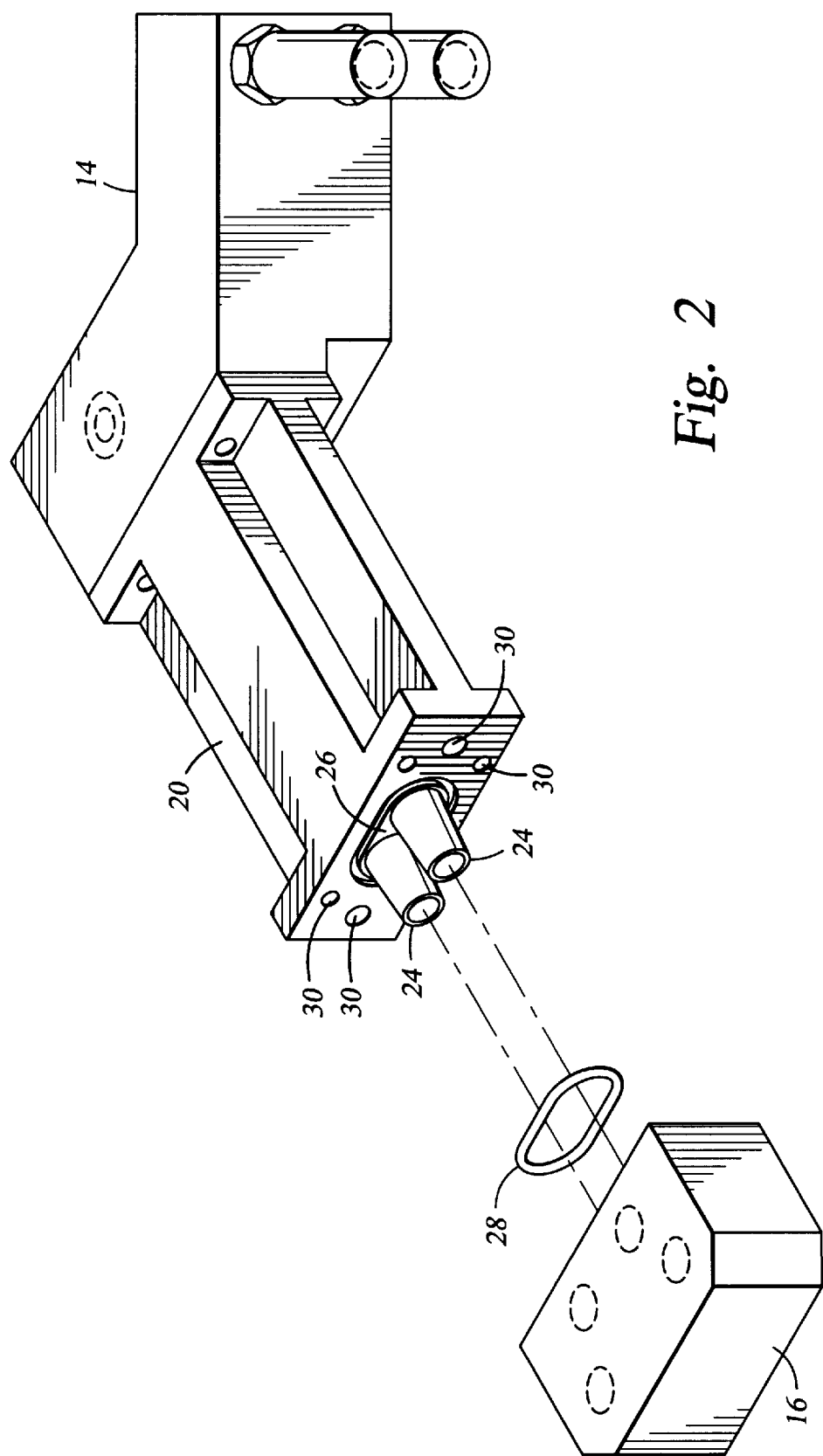

FIG. 2 depicts a dual gas feedthrough 20 of the present invention. The gas feedthrough 20 of this invention is made of an electrostatic discharge plastic and extends between the grounded gas inlet manifold 14 and the RF hot gas outlet manifold 16. The ends of a pair of gas lines 24 are recessed in channels (not shown) formed in both the inlet and outlet manifolds. The gas lines 24, preferably made of quartz or similar material, are disposed in the feedthrough 20 which is positioned between the inlet and outlet manifolds to prevent plasma formation within the gas lines. Running axially through the feedthrough is a void or channel 26 to receive the gas lines. Alternatively, the channel 26 may be filled around the gas lines with an appropriate insulating plastic for insulation and to retain the gas lines in a parallel, spaced-apart orientation.

The structure thus described eliminates the resistive sleeve described above, as well as the components needed to retain the sleeve. The structure further includes a pliant seal ring 28 to seal between the feedthrough and the manifold 26, and a similar seal ring (not shown) between the feedthrough and the manifold 14. The feedthrough is provided with bolt holes 30, for mounting the feedthrough to the manifolds.

The resistance of the feedthrough, formed of a static-dissipative composite, is less than the resistance of the gases which are fed through the gas lines so that the energy which is applied to the outlet manifold 16 is not transferred to the gases. The material of construction preferably falls within the $10^6$ to $10^{10}$ range of the materials shown in FIG. 3. Such a material is made as a composite comprising carbon black, or even powdered metal, of sufficient concentration mixed with a suitable plastic to provide the resistivity desired.

The feedthrough is designed to provide a linear voltage gradient along the feedthrough from a high radio frequency (RF) potential to ground to maintain process gas integrity through a given channel length.

While the foregoing is directed to the preferred embodiment of the present invention. Other and further embodiments of the invention may be devised without departing from the basic scope thereof, and the scope thereof is determined by the claims which follow.

We claim:

1. An apparatus for preventing the transfer of energy to a gas fed through a gas line, the apparatus comprising a gas feedthrough comprising a static-dissipative material, the feedthrough having a first end for abuttingly contacting an electrically energized member and a second end for abuttingly contacting a grounded member, the feedthrough defining a void therein along its length to house a gas line therethrough.

2. The apparatus of claim 1, further comprising a seal ring between the first end of the feedthrough and the electrically energized member.

3. The apparatus of claim 2, further comprising a seal ring between the first end of the feed through and the grounded member.

4. The apparatus of claim 1, wherein the bulk resistivity of the feedthrough is in a range from about $1.25 \times 10^6$ to about $5 \times 10^6$ ohm-centimeters.

5. The apparatus of claim 4, wherein the void houses a pair of gas lines in spaced-apart parallel relation.

6. The apparatus of claim 4, wherein the void houses a pair of gas lines retained in spaced-apart parallel relation by an insulating material between the pair of gas lines and the feedthrough.

7. The apparatus of claim 1, wherein the feedthrough is a unitary body.

8. An apparatus for providing a gas to a processing chamber, comprising:

a) a gas inlet manifold into which process gases are introduced from a gas source;
b) a gas outlet manifold which is connected to a power source and provides an inlet into the chamber;
c) at least one gas line extending between the gas inlet and the gas outlet; and
d) a static-dissipative feedthrough disposed about the gas line.

9. An apparatus for preventing the transfer of energy to a gas fed through a gas line, comprising:

a gas feedthrough, wherein a bulk resistivity of the feedthrough is in a range from about $1.25 \times 10^6$ to about $5 \times 10^6$ ohm-centimeters, the feedthrough having a first end for abuttingly contacting an electrically energized member and a second end for abuttingly contacting a grounded member, the feedthrough defining a void therein along its length.

10. The apparatus of claim 9, wherein the feedthrough is a unitary body.

* * * * *

UNITED STATES PATENT AND TRADEMARK OFFICE
CERTIFICATE OF CORRECTION

PATENT NO. : 6,170,430 B1
DATED : January 9, 2001
INVENTOR(S) : Cheung et al.

Figure 3:
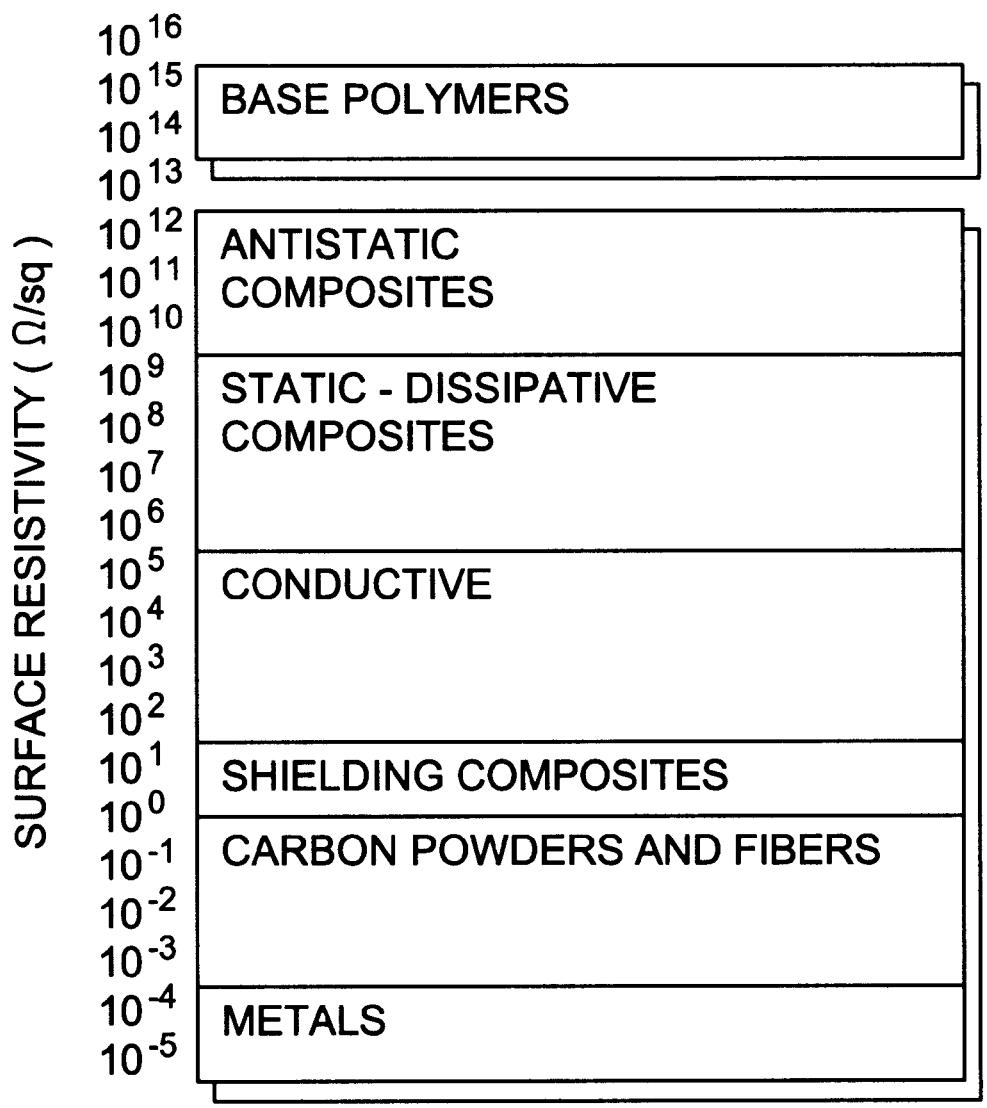

It is certified that error appears in the above-identified patent and that said Letters Patent is hereby corrected as shown below:

Column 3,
Line 1, please insert "It is to be noted, however, that the drawings illustrate only a typical embodiment of this invention and therefor do not limit the scope of the invention, which may admit to other equally effective embodiments.
Figure 1 is a schematic view of a prior art gas distribution plate.
Figure 2 is an exploded view of a dual gas feedthrough formed of a static-dissipative composite in accordance with this invention.
Figure 3 is a schematic graph depicting the spectrum of surface resistivity of electrostatic discharge plastics as used in this invention."

Signed and Sealed this

Twentieth Day of November, 2001

Attest:

NICHOLAS P. GODICI
Attesting Officer  Acting Director of the United States Patent and Trademark Office